United States Patent
Martensson

(10) Patent No.: US 8,103,999 B1
(45) Date of Patent: Jan. 24, 2012

(54) DEBUGGING OF COUNTEREXAMPLES IN FORMAL VERIFICATION

(75) Inventor: Johan Martensson, Gothenburg (SE)

(73) Assignee: Jasper Design Automation, Inc., Mountain View, CA (US)

(*) Notice: Subject to any disclaimer, the term of this patent is extended or adjusted under 35 U.S.C. 154(b) by 371 days.

(21) Appl. No.: 12/140,172

(22) Filed: Jun. 16, 2008

Related U.S. Application Data

(60) Provisional application No. 60/944,221, filed on Jun. 15, 2007.

(51) Int. Cl.
*G06F 17/50* (2006.01)

(52) U.S. Cl. .................................................... 716/106

(58) Field of Classification Search .............. 716/1, 5, 716/100, 106
See application file for complete search history.

(56) References Cited

U.S. PATENT DOCUMENTS

| | | | |
|---|---|---|---|
| 6,975,976 B1* | 12/2005 | Casavant et al. ............... | 703/14 |
| 7,249,332 B1* | 7/2007 | Agmon ............................ | 716/5 |
| 7,421,668 B1* | 9/2008 | Ip et al. .......................... | 716/5 |
| 7,454,324 B1* | 11/2008 | Seawright et al. .............. | 703/14 |
| 2002/0046393 A1* | 4/2002 | Leino et al. ...................... | 717/7 |
| 2003/0208730 A1* | 11/2003 | Singhal et al. .................. | 716/4 |
| 2004/0117746 A1* | 6/2004 | Narain et al. .................... | 716/4 |
| 2005/0081169 A1* | 4/2005 | Levitt et al. ..................... | 716/5 |
| 2005/0188337 A1* | 8/2005 | Baumgartner et al. .......... | 716/6 |
| 2007/0011629 A1* | 1/2007 | Shacham et al. ................ | 716/3 |
| 2007/0174798 A1* | 7/2007 | Baumgartner et al. .......... | 716/5 |
| 2009/0024557 A1* | 1/2009 | Fuhrmann et al. .............. | 706/58 |
| 2010/0293530 A1* | 11/2010 | Ivancic et al. .................. | 717/126 |

* cited by examiner

*Primary Examiner* — Suchin Parihar

(74) *Attorney, Agent, or Firm* — Fenwick & West LLP

(57) ABSTRACT

The result of a property based formal verification analysis of a circuit design may include at least one counterexample for each property that is violated, which a user can use to debug the circuit design. To assist the user in this debugging process, a debugging tool displays the counterexample trace annotated in such a way to illustrate where the property violation occurs and what parts of this trace contributes to the property violation. The debugging tool thus facilitates understanding of what parts of the counterexample trace are responsible for the property failure. The user can then select any of those contributing points as a starting point for further debugging.

25 Claims, 9 Drawing Sheets

DEBUGGING OF COUNTEREXAMPLES IN FORMAL VERIFICATION

CROSS REFERENCE TO RELATED APPLICATIONS

This application claims the benefit of U.S. Provisional Application No. 60/944,221, filed Jun. 15, 2007, which is incorporated by reference in its entirety.

BACKGROUND

This invention relates generally to formal verification of circuit designs, and more particularly to debugging counterexamples found in formal verification.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation, and formal verification. RTL describes the registers of a computer or digital electronic system and the way in which data are transferred among the combinational logic between registers.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design. An increasingly popular technique is to use formal methods to verify the properties of a design completely. Formal methods use mathematical techniques to prove that a design property is either always true or to provide an example condition (called a counterexample) that demonstrates the property is false. Tools that use formal methods to verify RTL source code and design properties are known as "model checkers." Design properties to be verified include specifications and/or requirements that must be satisfied by the circuit design. The formal verification technology requires that the requirements are expressed in a formal notation, for example a temporal language, which enables an exhaustive mathematical check whether a design complies with the requirements.

Although a counterexample demonstrates an example condition under which a circuit design fails a property, the cause of the failure is not always obvious. Accordingly, what are needed are techniques to view and analyze the results of formal verification of a circuit design (such as a counterexample) to help circuit designers understand the results obtained from the formal verification (e.g., why a particular property failed).

SUMMARY

The result of a property based formal verification analysis of a circuit design may include at least one counterexample for each property that is violated, which a user can use to debug the circuit design. To assist the user in this debugging process, embodiments of the invention include a debugging tool that displays the counterexample trace annotated in such a way to illustrate where the property violation occurs and what parts of this trace contributes to the property violation. In this way, the debugging tool facilitates understanding of what parts of the counterexample trace are responsible for the property failure. The user can then select any of those contributing points as a starting point for further debugging.

Embodiments of the invention include a debugging tool that helps the circuit designer better understand counterexamples, and thereby more easily debug the circuit design when counterexamples are found. In one embodiment, for a counterexample identified during the formal verification process, the debugging tool selects a set of explanatory points for the violated property. The set of explanatory points illustrates what parts of the counterexample directly contribute to the violation of the property. Rather than merely presenting a trace for the counterexample, the debugging tool may thus present the circuit designer with the trace showing the counterexample along with the explanatory points.

The debugging tool may also present additional information that might help the designer understand the nature of how the counterexample violates the property. This additional information may comprise, for example, annotations, markings, coloring, and/or other indicia or formatting on the trace that illustrates the counterexample. The information may also comprise selected portions of the circuit design code that is related to the counterexample trace, with any coloring or formatting that may assist in the understanding of the counterexample.

In other embodiments, the debugging tool need not be limited to analysis of counterexamples obtained from formal verification. For example, embodiments of the techniques described herein may be used to highlight traces that are produced in a simulation of a circuit design, provided that a property fails on such a trace. Accordingly, the invention need not be restricted to formal verification.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Tool Flow and Methodology for Formal Verification

Figure 1:
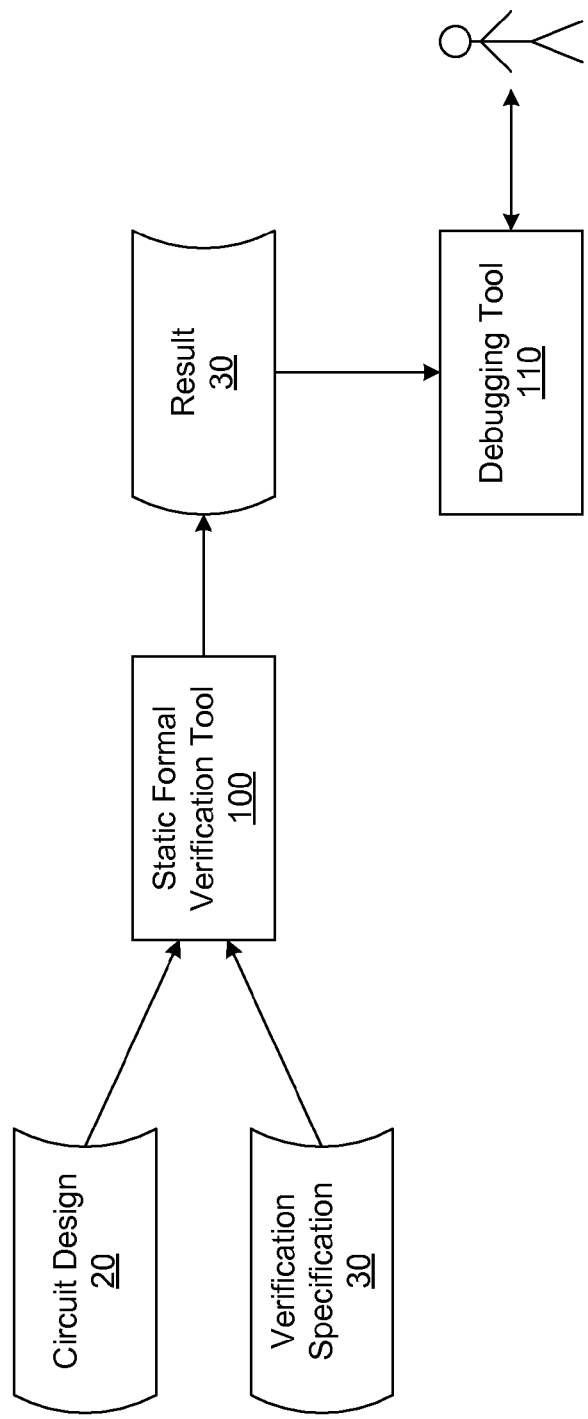
FIG. 1 is a diagram of a verification methodology in accordance with an embodiment of the invention.

FIG. 1 illustrates an embodiment of a methodology for formal verification of a circuit design 20. The circuit design 20 may be embodied in a data file encoded using a hardware description language (HDL), which may describe the structural design and operation of a circuit. A set of requirements is derived from a design specification for the circuit and then used to test whether the circuit design is compliant with the design specification. A user, such as a circuit designer or a verification engineer, may supply the requirements for the circuit design. The requirements may be encoded in a verification specification 30 as one or more properties for the circuit design 20, encoded for example using Property Specification Language (PSL) or SystemVerilog Assertion (SVA). The verification specification 30 may be directly coded by a user or captured in an automated process. A property may be represented in the verification specification 30 as an assertion, where the assertion is satisfied if the property is true for all operating conditions of the circuit design 20. A property may also be represented in the verification specification 30 as a cover, where the cover is satisfied if the property is true for some operating condition of the circuit design 20.

In a formal verification process, the verification tool 100 receives a circuit design 20 and a verification specification 30 for testing the circuit design 20 against a set of requirements. The circuit design 20 and verification specification 30 may be represented in one or more files containing HDL code, which define a digital design and/or properties that give a functional specification of the design. The verification tool 100 may convert the inputs (i.e., the circuit design 20 and verification specification 30) into an internal representation using one or more data structures, such as a netlist. This conversion may comprise two different conversions: (1) synthesis of the input circuit design 20, and (2) property compilation of the properties in the verification specification 30.

The results of the design synthesis and the property compilation are then combined into a common problem instance that is given as input to a model checker in the verification tool 100. The verification tool 100 then performs formal verification on the circuit design 20 using the statically allocated data structure. For asserts, during the formal verification process, the model checker attempts to determine whether there is a possible behavior of the circuit design 20 where one of the properties in the verification specification 30 are not true, which is called a counterexample for the property. If, it is determined that no counterexample exists for a property, the property is said to be proven. The results 30 of the formal verification process thus comprise an indication of whether one or more of the properties are satisfied, and if not, the counterexample showing a condition under which the property fails. The tool 100 outputs the result 30 of the verification process.

The verification of a cover may proceed in a similar way. In one embodiment, for a cover, the verification tool attempts to find a counterexample to the negation of the property. This counterexample is called a cover trace. Thus, the techniques described below concerning asserts may be applied to covers as well.

The result 30 of the formal verification process may be stored in memory, passed along to another software process, or displayed to the user. The result may comprise a counterexample if the circuit design 20 fails to meet the properties encoded in the verification specification or a witness if the design 20 satisfies the properties. A debugging tool 110 may also be included to display the counterexample or witness to a circuit designer in a useful way to the designer. This can facilitate understanding of what aspect of the HDL code in the circuit design 20 is responsible for the counterexample to the property in question. The debugging tool 110 may include a viewer as well as editing software.

Debugging Tool

Figure 2:
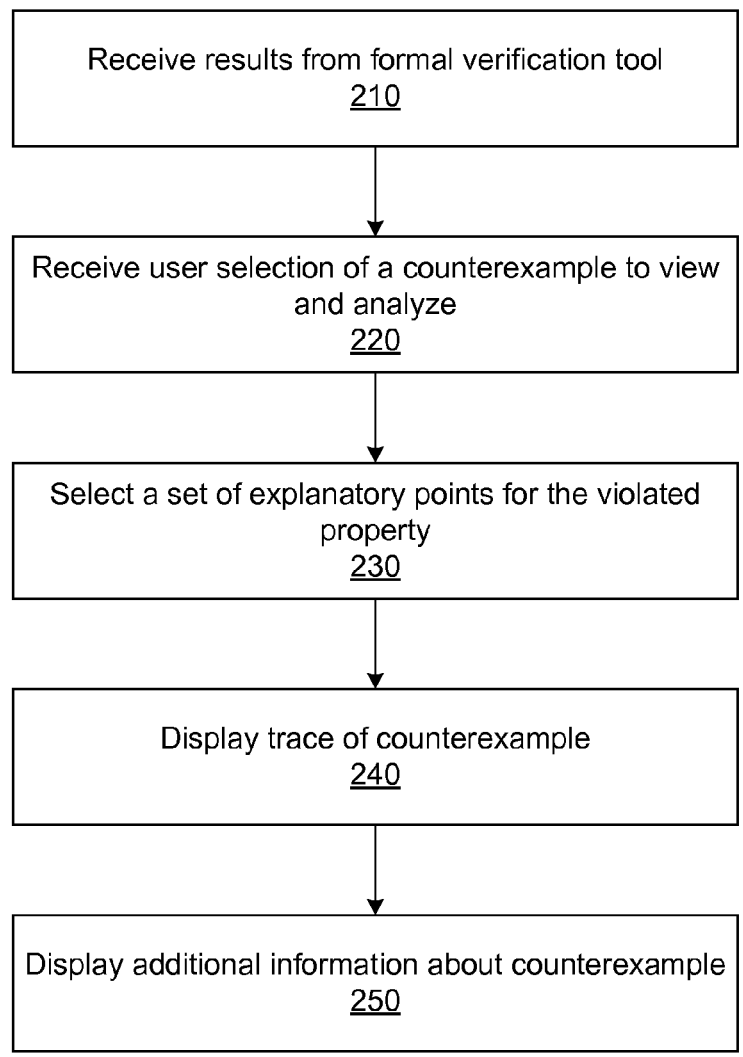
FIG. 2 is a flow chart of an operation of a debugging tool, in accordance with an embodiment of the invention.

Embodiments of the invention provide for a debugging tool that may help the circuit designer better understand counterexamples, and thereby more easily debug the circuit design when counterexamples are found. An example operation of the debugging tool is shown in FIG. 2, which can be performed for any counterexample identified during the formal verification process. The debugging tool first receives 210 the results from the verification tool and presents them to the user. The user may choose a counterexample to analyze, so the debugging tool receives 220 this user selection of which counterexample to analyze, where the counterexample is associated with a property violated by the circuit design.

The debugging tool then selects 230 a set of explanatory points for the violated property. The set of explanatory points illustrates what parts of the counterexample directly contribute to the violation of the property. The debugging tool displays 240 a trace with information that will assist the designer to understand the cause of the circuit design's behavior. Rather than merely present a trace for the counterexample, the debugging tool can present the circuit designer with the trace showing the counterexample along with the explanatory points, as well as additional information that might help the designer to understand the nature of how the counterexample violates the property. This additional information may comprise annotations, markings, coloring, and/or other formatting on the trace that illustrates the counterexample, and/or the information may comprise selected portions of the circuit design code itself related to the counterexample trace with any coloring or formatting that may assist in the understanding of the counterexample.

Described herein is an embodiment of an interface and an operation of a debugging tool that provides helpful information to a circuit designer when a counterexample is found. The interfaces and functionalities described herein are presented for explanation purposes, and it can be appreciated that a variety of other user interface techniques can be provided with the debugging tool to convey the same or similarly helpful information about the counterexample. As described, the debugging tool obtains a set of explanatory points. Preferably, this set of points is sufficient and minimal with respect to the property and the trace.

One way to explain why a certain trace is a counterexample to a certain property is to point to the signal@cycle points of the trace that together give an explanation for why the property fails at the trace. Such a set of points can be called a set of explanatory points for the property. A set of explanatory points of a trace is sufficient with respect to a certain property if any other trace that is identical to the trace in question at the explanatory points is also a counterexample to the property. Furthermore a sufficient set of explanatory points of a trace is minimal with respect to a property if it is such that if any point of the trace is removed it is no longer a sufficient set.

Figure 3:
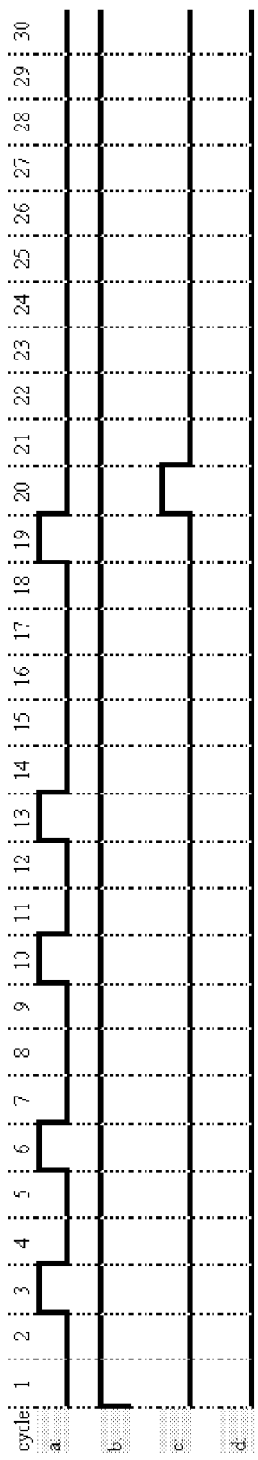
FIGS. 3 through 15 are example traces, which may be displayed by embodiments of the debugging tool.

Sometimes different sufficient and minimal sets of explanatory points can be identified for the same property and counter example. For example, given the PSL property $$\text{always } \{a;b[*];c\}|=>d$$

and the trace shown in FIG. 3, all of the following explanatory sets contain sufficient explanations why the property fails on the trace:

E3={a@3,b@4, . . . b@19,c@20,d@21}
E6={a@6,b@7, . . . b@19,c@20,d@21}
E10={a@10,b@11, . . . b@19,c@20,d@21}
E13={a@13,b@14, . . . b@19,c@20,d@21}
E19={a@19,c@20,d@21}

It is also the case that all supersets of the sets E3, . . . E19 are sufficient explanatory sets. Furthermore all of the sets E3, . . . E19 are minimal in the sense that they contain no smaller subset that is a sufficient explanatory set.

As this example demonstrates, the debugging tool may need to choose which minimal set among different possible minimal sets to display to the user. Embodiments of the debugging tool can use different possible candidates. One possibility is to select one of the shortest minimal sets, where the shortest set is the one having the least difference between the earliest cycle and the failure point. Another possibility is to select the minimal set that contains the least number of points. Alternatively, the selection may be based on a combination of the above considerations, as well as others criteria.

In one embodiment, a step-based algorithm is used, giving a set of explanatory points that is both sufficient and minimal. Embodiments of the algorithm described herein give a set of explanatory points that is sufficient in the following sense. A set of explanatory points gives a sufficient explanation of property failure if every other trace that has the same values on the explanatory points in question is also a counterexample to the property. Embodiments of the algorithm may also give a set of explanatory points that are minimal with respect to sufficiency in the following sense. A set of explanatory points is minimal (with respect to sufficiency) if the set is no longer sufficient if one point is removed from the set.

Figure 4:
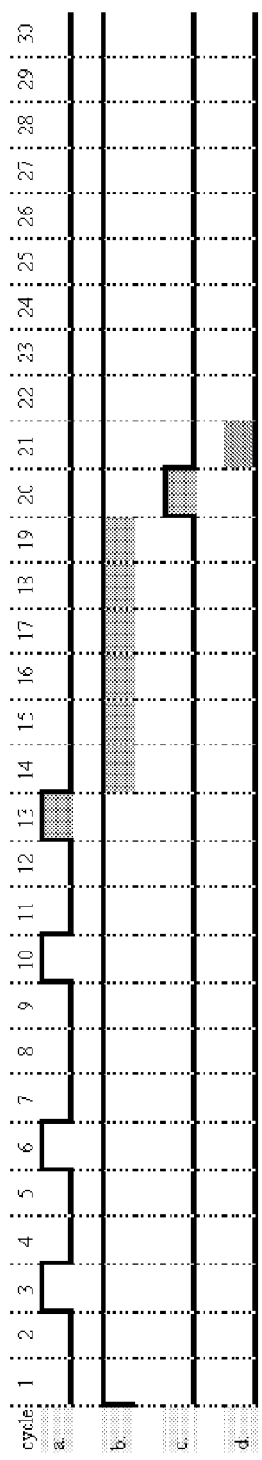

Based on the structure of the formula and the way the step algorithm is computed, distinctions can be made between different syntactic/semantic roles of explanatory points. In one embodiment, an important distinction is between a point that contributes to the triggering of a property and a point that contributes directly to the falsity of the formula. This is illustrated by the formula:

always {a;b[*];c}|=>d and the trace shown in FIG. 4. In this trace, the points a@13, b@14, . . . , b@19 and c@20 are colored blue, and the point d@21 is colored red (the colors displayable by the tool, but shown shaded in the figures). The blue markings indicate explanatory points that contribute to the triggering of the property and the red marking indicates an explanatory point that directly contributes to the failure of the property.

In another embodiment, the debugging tool may display this information by letting the user choose a cycle. The tool then displays the formula source, while coloring those signal instances, if any, in the formula source that have an explanatory point at that cycle. Continuing the previous example, this may be done with the following:

13 –>always {a;b[*];c}|=>d
14 –>always {a;b[*];c}|=>d
15 –>always {a;b[*];c}|=>d
. . .
19 –>always {a;b[*];c}|=>d
20 –>always {a;b[*];c}|=>d
21 –>always {a;b[*];c}|=>d In this example, at cycle 13, a is colored blue; at cycles 14 to 19, b is colored blue; at cycle 20, c is colored blue; and at cycle 21 d, is colored red.

Figure 5:
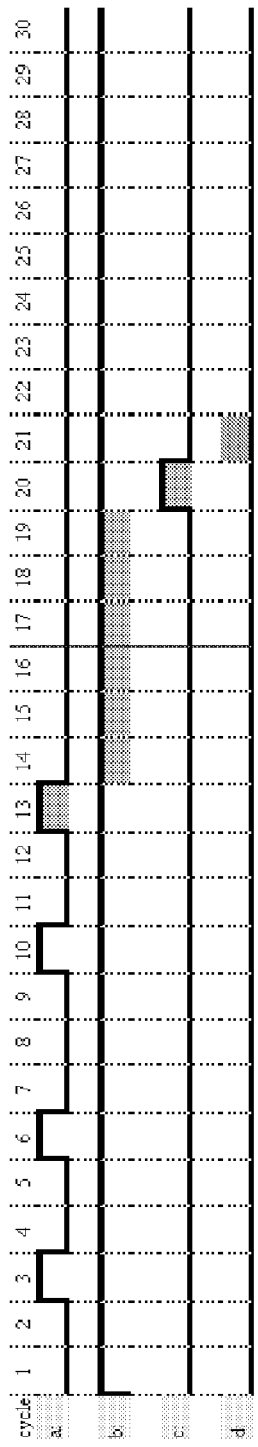

In one embodiment, the debugging tool allows the user to indicate a certain cycle. This indication can be made via a movable vertical ruler that can be placed at a certain cycle with a mouse click. An example is shown for always {a;b[*];c}|=>d and the trace illustrated in FIG. 5. In this trace, the points a@13, b@14, . . . , b@19, and c@20 are colored blue, and the point d@21 is colored red. This trace can be used for stepping through the counterexample and follow for each successive cycle what parts of the formula or the HDL source code that get activated in evaluating the formula.

For example, for the formula always {r1; r2; r3 }|=>{r4} and the Verilog source code defining a circular shift among the registers r1, r2 and r3:

```
always @(posedge cl_fast,posedge rst)
  begin
    if (rst==1)
      begin
        r1 <= 1;
        r2 <= 0;
        r3 <= 0;
        r4 <= 0;
      end
    else
```

-continued

```
    begin
      r4 <= r2;
      r3 <= r2;
      r2 <= r1;
      r1 <= r3;
    end
  end
```

Figure 6:
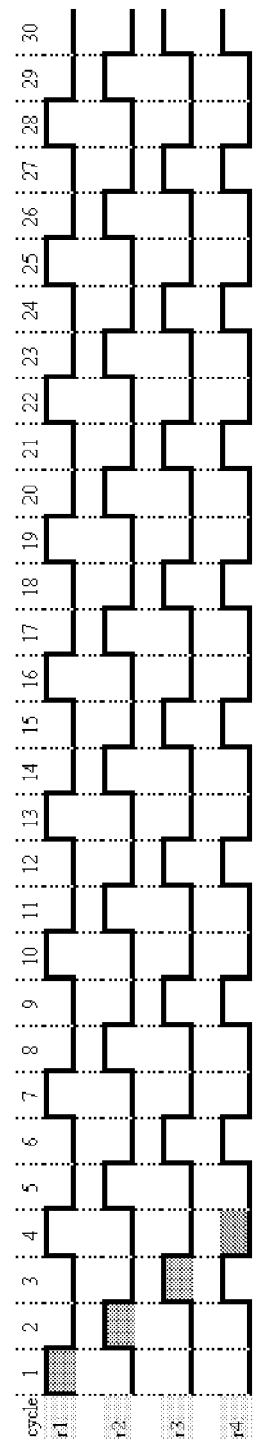

The counterexample shown in FIG. 6 is obtained. In this trace the points r1@1, r2@2 and r3@3 are colored blue, and the point r4@4 is colored red.

This information can be used to provide stepwise highlighting of the source:

Cycle 1:

```
if (rst==1)
  begin
    r1 <= 1;
    .
    .
  end
```

At cycle 1, the value 1 that is assigned to r1 is colored blue.

Cycle 2:

```
if (rst==1)
  .
  .
else
  begin
    .
    .
    r2 <= r1;
    .
    .
  end
```

At cycle 2, r1 that is assigned to r2 is colored blue.

Cycle 3:

```
if (rst==1)
  .
  .
else
  begin
    .
    .
    r3 <= r2;
    .
    .
  end
```

At cycle 3, r2 that is assigned to r3 is colored blue.

Cycle 4:

```
if (rst==1)
  .
  .
else
```

Cycle 4:

```
begin
 .
 .
 r4 <= r2;
end
```

At cycle 4, r2 that is assigned to r4 is colored blue.

Figure 7:
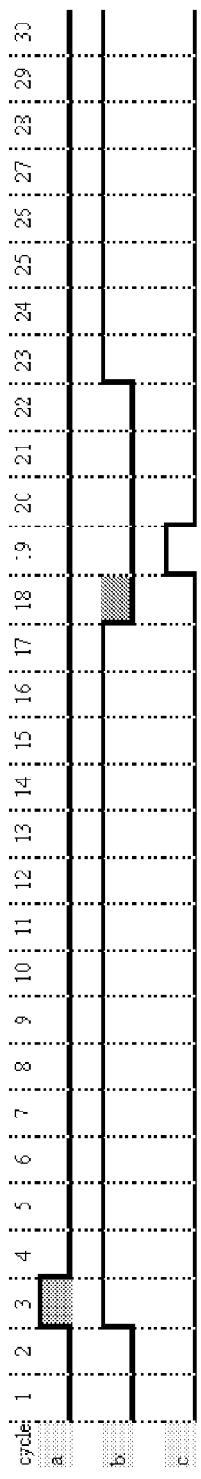
Figure 8:
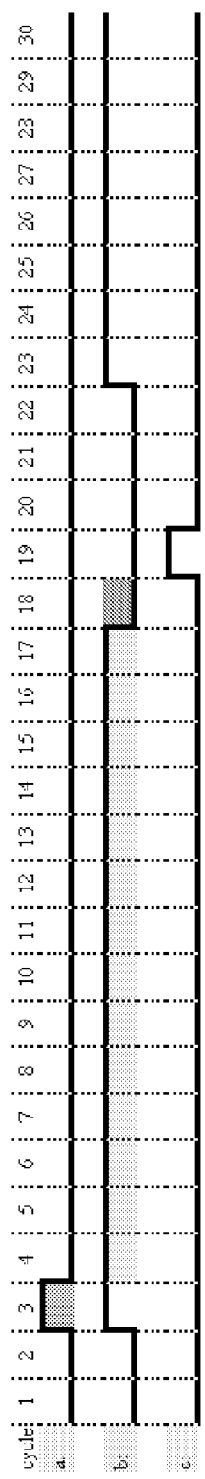

One can choose to include points that are non-essential for explanatory sufficiency but which contribute to the understanding of why a certain value has been checked. For example, for the formula:

always {a}|=>{b[*15];c} on the trace shown in FIG. 7. Only a@2 (blue) and b@17 (red) are essential to explain failure, but the user may want to have an indication that it is via the long row of confirming b's—b@3, ... b@16 (colored green in the following example)—that b@17 is reached.

Figure 9:
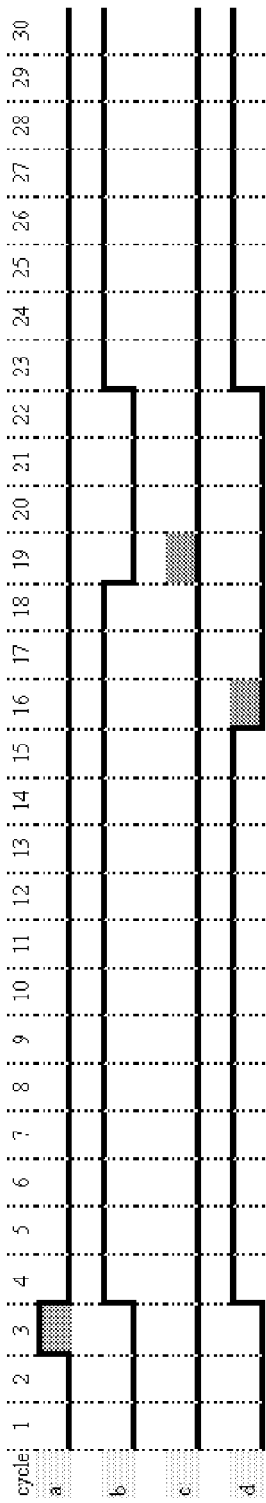
Figure 10:
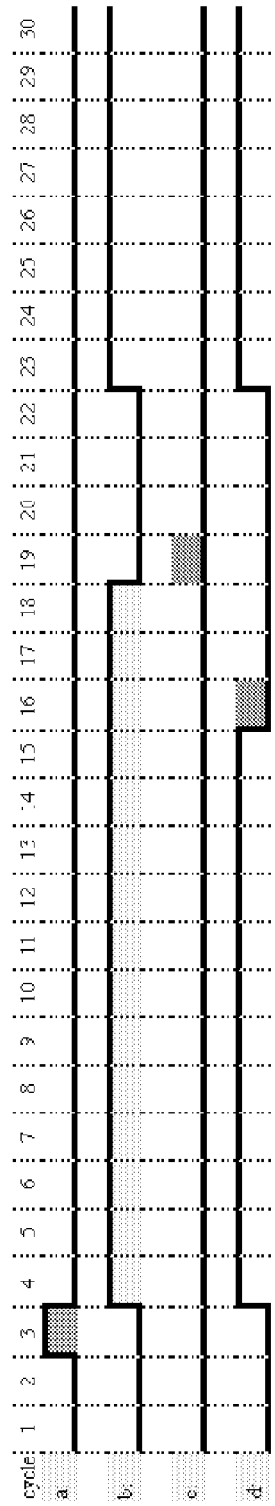
Figure 11:
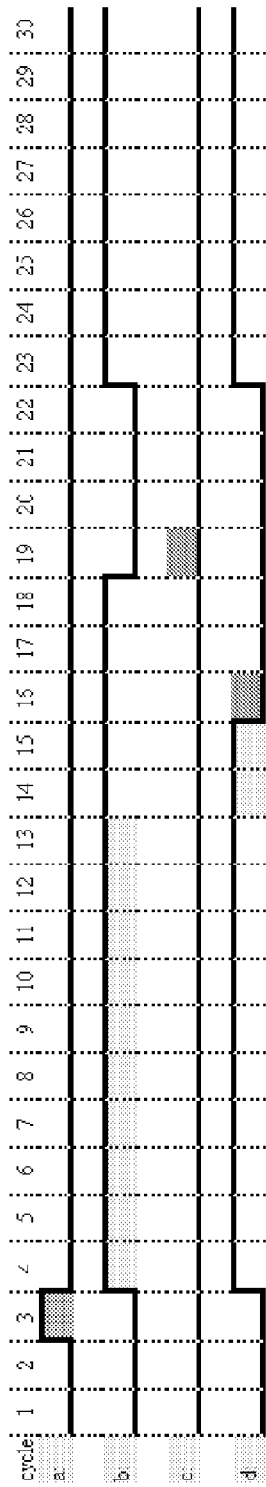

When the formula is detected to be false in the syntactic failure check it may be a disjunction. This means that each of the disjuncts are computed to be false. It is noted that in this situation, each and every one of the disjuncts need to be false for the property to fail. In this case the formula "has reached falsity" along different threads. This information is available and may be of value to the user. For example, for the formula always {a}|=>{{b[*15];c}|{b[*10];d[*3]}} and the trace shown in FIG. 9. The property fails at two separate explanatory points, d@16 (red) and c@19 (red), both of which are needed to explain failure. It may not be evident to the user, however, how these points were reached in the evaluation of the property. This may be explained by means of a threaded display of intermediate points, as in FIGS. 10 and 11. In the trace shown in FIG. 10, a@3 is colored blue; b@4, ..., b@18 are green; d@16 is grey; and c@19 is red. In the trace shown in FIG. 11, a@3 is colored blue; b@4, ..., b@13; d@14 and d@15 are green; d@16 is red; and c@19 is gray. In one embodiment, the user can click on the different red points separately to see how each of them was reached.

Figure 12:
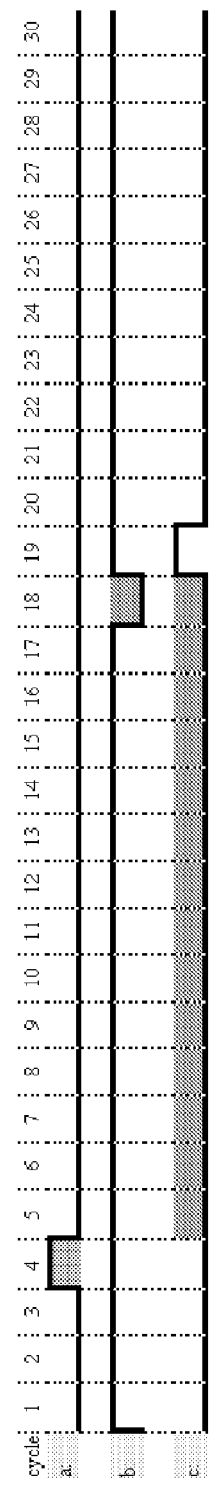
Figure 13:
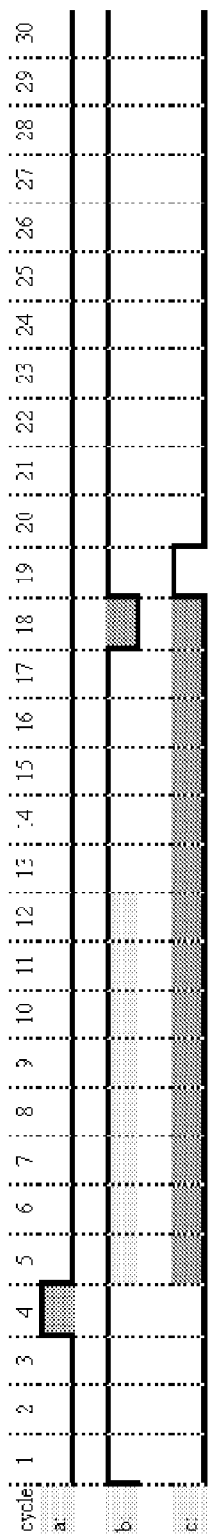

Embodiments of the debugging tool support multithreading. The following formula:

always {a}|=>{b[*];c} will have the minimal set of explanatory points on the trace shown in FIG. 12. In the trace of FIG. 12, a@4 is colored blue, and c@5, ..., c@18 and b@18 are red. The tool may indicate for each disconfirming explanatory point separately the thread of confirming signal@cycle points leading up to it. This is shown in the trace of FIG. 13, where a@4 is colored blue; c@5, ..., c@12 and c@14, ..., c@18; b@18 are grey; and c@13 is red.

The following formula contains different instances of the signal rcving:

always {!rcving;rcving}|=>{rcving[*]}; {done_rcving & !rcving}

Figure 14:
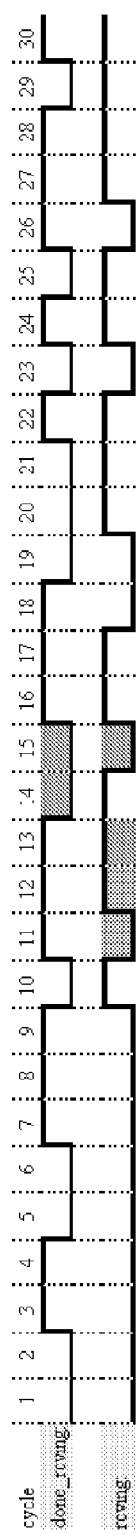
Figure 15:
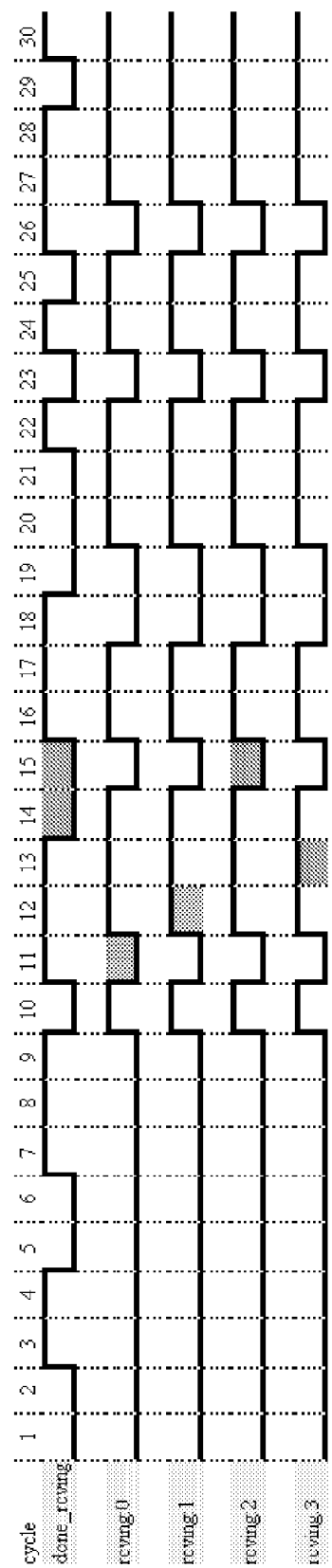

This fails on the trace shown in FIG. 14, with the explanatory points in a minimal such set colored red and blue. In this trace, rcving@11 and rcving@12 are colored blue; and rcving@13, rcving@15, done_rcving@14, and done_rcving@15 are red. The rcving signal may seem a little cluttered with explanatory points in this diagram. In fact, the different explanatory points can be seen to be distributed over the different instances of this signal, as can be seen in the trace shown in FIG. 15. In the trace of FIG. 15, there are four different waveforms for the same signal rcving. The tool may show how different explanatory points distribute over the different instances of rcving in the formula. Here rcving:0 is the first occurrence of rcving in the formula, rcving:1 the second, and so on. In the trace of FIG. 15, rcving:0@11 and rcving:1@12 are colored blue; and rcving:3@13, rcving:2@15, done_rcving@14, and done_rcving@15 are red.

This differentiated information can be used to highlight the different instances of rcving when stepping through the formula.

10->always {!rcving;rcving}|=>{rcving[*]}; {done_rcving & !rcving}

11->always {!rcving;rcving}|=>{rcving[*]}; {done_rcving & !rcving}[rcving:0 is blue]

12->always {!rcving;rcving}|=>{rcving[*]}; {done_rcving & !rcving}[rcving:1 is blue]

13->always {!rcving;rcving}|=>{rcving[*]}; {done_rcving & !rcving}[rcving:3 is red]

14->always {!rcving;rcving}|=>{rcving[*]}; {done_rcving & !rcving}[done_rcving is red]

15->always {!rcving;rcving}|=>{rcving[*]};{done_rcving & !rcving} [done_rcving and rcving:2 are red]

16->always {!rcving;rcving}|=>{rcving[*]};{done_rcving & !rcving}

Use Model

In one embodiment, a user uses the debugging tool to view and analyze counterexamples found in formal verification. The debugging tool obtains the results from a formal verification tool and selects a disproved property (i.e., a property for which the formal verification tool found a counterexample). The debugging tool displays a plot window showing a trace diagram with the signals contained in the property showing the counterexample. In this trace diagram, the essential explanatory points are marked red or blue. If there is only one thread, inessential points indicating this thread may also be present (e.g., in green). If there is more than one thread, green points may be absent and can be brought forward by a user action such as clicking on red points.

The user may then choose to bring up a steppable source code viewer for either the PSL/SVA property source or the relevant HDL source. Using the steppable property source viewer in the debugging tool, the trace in question can be stepped through showing with color markings which property signal instances are marked as either blue, green, or red at the respective cycle of the counterexample. In this way, the user can view and analyze the counterexamples found during formal verification to understand the counterexamples better and thus debug the errors in the circuit design leading to the violation of the property.

In another embodiment, the debugging tool can be used to highlight cover traces and show the points in the cover trace that explain why the trace exemplifies the property or sequence to be covered. A cover trace is a counterexample to the negation of the covered property. Therefore, the same algorithm used to highlight counterexamples to asserts can be used to highlight cover traces.

Algorithm

Described herein is one algorithm for computing a set of explanatory points. The ATD function defined below will take a finite trace and a property as arguments and return a set of points of that trace. If the property fails on the trace, the returned set of points is a set of explanatory points as explained above, giving a sufficient and minimal explanation of the failure of the property.

Initial Definitions

We start by defining abstract and concrete words and letters. In order to model runs of a hardware system we use the concept of a word. A word w can be thought of as a possibly infinite sequence of states of the system (the letters), where each of the states (each letter) defines a value for all signals of the system.

We introduce abstraction at this point because we want to talk about "partial" runs, for example those parts of runs that are explanatory sets. Let $\Sigma$ be a set of atoms. A letter l is a pair $\langle T,F \rangle$ of subsets of $\Sigma$ where $\langle T \cap F \rangle = \emptyset$. If $S \subseteq \Sigma$ then a letter $\langle T,F \rangle$ is full (concrete) with respect to S if $S = \langle T \cup F \rangle$.

Definition 1 A letter $\langle T,F \rangle$ is an abstraction of a letter $\langle T',F' \rangle$ ($\langle T,F \rangle \sqsubseteq \langle T',F' \rangle$) if $T \subseteq T'$ and $F \subseteq F'$. (And $l \sqsubseteq l'$ if $l \neq l'$ and $l \sqsubseteq l'$.) Obviously, $\sqsubseteq$ is a partial order on the set of letters. A letter $\langle T,F \rangle$ is empty if both T and F are empty.

Definition 2 $\langle T,F \rangle \sqcap \langle T',F' \rangle = \langle T \cap T', F \cap F' \rangle$. If $\langle T,F \rangle$ and $\langle T',F' \rangle$ are letters then $\langle T,F \rangle \sqcap \langle T',F' \rangle$ is a letter.

Definition 3 $\langle T,F \rangle \sqcup \langle T',F' \rangle = \langle T \cap T', F \cup F' \rangle$. There are letters $\langle T,F \rangle$ and $\langle T',F' \rangle$ such that $\langle T,F \rangle \sqcup \langle T',F' \rangle$ is not a letter. For example, it may be the case that $T \cap F' \neq \emptyset$, in which case $(T \cup T') \cap (F \cup F') \neq \emptyset$.

An infinite (finite) word (w,v,u) is a list $l_0, l_1, l_2, \ldots$ ($l_0, \ldots l_{n-1}$) of letters. We will also regard words as mappings from the integers (or a prefix of the integers) into the set of letters, this means that w(n) is the n+1th letter of w. $v \leq u$ means v is a prefix of u. SI(w) the start index of w is the index of the first letter of w. A cycle number (n) is any non negative integer.

Definition 4 A work w is an abstraction of a word w' ($w \sqsubseteq w'$) if for each cycle number n, $w(n) \sqsubseteq w'(n)$. (And $w \sqsubset w'$ if $w \neq w'$ and $w \sqsubseteq w'$.)

Definition 5 $w \sqcap w' = w''$ if and only if for each n, $w''(n) = w(n) \sqcap w'(n)$.

If w and w' are letters then $w \sqcap w'$ is a letter.

Definition 6 $w \sqcup w' = w''$ if and only if for each n $w''(n) = w(n) \sqcup w'(n)$.

There are words w and w' such that $w \sqcup w'$ is not a word. For example it may be the case that for some n $w(n) \sqcup w'(n)$ is not a letter.

The building blocks of PSL/SVA formulas are Boolean formulas. We define satisfaction for Boolean formulas on letters in such a way that we make explicit what signal values were needed to determine satisfaction.

We try to do this in an economical way, respecting sufficiency and minimality. For example if a conjunction is false we only collect the signals that were needed for falsifying one of the false conjuncts.

Boolean satisfaction

A Boolean formula is a Boolean combination of elements of $\Sigma$.

Definition 7

$$b ::= |a| \neg b | b \wedge b | b \vee b$$

Boolean satisfaction on full letters is defined in the following way: $bs(b,l) = \langle tf, U \rangle$ where tf is the value of $l \vDash b$ in the usual sense of boolean satisfaction and U is the subset of $\Sigma$ that needed to be looked up to establish this fact.

Assume that $l = \langle T_l, F_l \rangle$ is full with respect to $S \subseteq \Sigma$ (i.e. $F_l = S \setminus T_l$).

Definition 8 Let $a \in S$ and $b, b_1$ and $b_2$ be any boolean formula.

$$bs(a, l) = \langle a \in T_l, \{a\} \rangle$$

$$bs(\neg b, l) = \langle \neg tf, U \rangle \text{ where } \langle tf, U \rangle = bs(b, l)$$

$$bs(b_1 \wedge b_2, l) = \langle tf, U \rangle \text{ where}$$
$$tf = tf_1 \wedge tf_2$$
$$U = \begin{cases} U_1 \cup U_2 & \text{if } tf \\ U_2 & \text{if } \neg tf \wedge tf_1 \\ U_1 & \text{otherwise.} \end{cases}$$
$$\langle tf_1, U_1 \rangle = bs(b_1, l)$$
$$\langle tf_2, U_2 \rangle = bs(b_2, l)$$

$$bs(b_1 \vee b_2, l) = \langle tf, U \rangle \text{ where}$$
$$tf = tf_1 \vee tf_2$$
$$U = \begin{cases} U_1 \cup U_2 & \text{if } \neg tf \\ U_2 & \text{if } tf \wedge \neg tf_1 \\ U_1 & \text{otherwise.} \end{cases}$$
$$\langle tf_1, U_1 \rangle = bs(b_1, l)$$
$$\langle tf_2, U_2 \rangle = bs(b_2, l)$$

Properties of the AD Functions

Below, in Definition 28, we will define the ATD function. The ATD function applied to a finite word u and a formula p will return an abstraction u' of that word.

$$ATD(u,p) = u' \Rightarrow u' \sqsubseteq u$$

This abstraction represents a (possibly empty) set of explanatory points for the word and the formula in question. Here we define sufficiency and minimality formally. ($\vDash$+denotes strong formula satisfaction as defined in the PSL/SVA LRM.)

The ATD Property

The ATD function should have the following property: If w is a (full) word and p is a (non pathological) safety property and $w \nvDash p$ and u is the shortest prefix of w such that $u \vDash + notp$ and ATD(u,p)=u' then 1. for any full v such that $u' \sqsubseteq v$, $v \vDash + notp$ (sufficiency).
2. if $u'' \sqsubset u'$ then there is full v such that $u'' \leq v$, $v \nvDash + notp$ (minimality)
3. for all u" that also fulfills (1) and (2) with respect to u and p, then u' is at least as good as $u''^{u''(u'' \leq_g u')}$ at explaining the fact that $u \vDash + notp$.
   (1) requires that the abstraction returned by the ATD function is sufficient to explain the failure of the property. (See Observation 1)
   (2) requires that the abstraction returned by the ATD function is a minimal one explaining the failure of the property. (See Observation 1)
   (3) requires that the abstraction returned is at least as good as any other sufficient minimal explanation. Presumably this requirement should amount to some sort of minimality among the minimal explanations.

We need to specify the 'at least as good' part. Let start(u) be the least cycle number n such that u(n) is nonempty if there is one otherwise it is undefined. If u,v and w are finite words and $u, v \sqsubseteq w$ then $u \leq_g v$ if $$start(u) \leq start(v) \text{ (Shortest ATD)}$$

The Core PSL Language with ATD

We will give a operational semantics for the core PSL/SVA language which will not only be usable for computing the semantic value of a formula on a run but will also compute the relevant set of explanatory points. We will define a data structure that will hold information on collected possible explanatory points. This data structure can be attached to arbitrary nodes in the abstract syntax tree. We will also define some operations on this data structure that will be needed for defining the various formula transformations required by the operational semantics.

Syntactic Definitions $$Seq ::= | \langle [*0], US\rangle | \langle \perp, US\rangle | \langle b, US\rangle$$
$$| \langle (Seq_1 \&\& Seq_2), US\rangle | \langle (Seq_1 | Seq_2), US\rangle |$$
$$\langle (Seq_1; Seq_2), US\rangle$$
$$| \langle (Seq_1; Seq_2), US\rangle | \langle Seq[*], US\rangle$$

Definition 15

$$Pred ::= | \langle alwaysPred, UP\rangle |$$
$$\langle (Pred_1 untilPred_2), UP\rangle | \langle next[n]Pred, UP\rangle$$
$$| \langle (Pred_1 and Pred_2), UP\rangle | \langle (Pred_1 or Pred_2), UP\rangle$$
$$| \langle (Seq \mapsto Pred), UP\rangle | \langle (Pred abortb), UP\rangle$$
$$| \langle \{Seq\}, UP\rangle$$

Definition 16

Note that there is no negation in the Pred language. For simplicity we assume that the language is negation free. For simplicity we write s for $\langle s, emptyUS\rangle$ and $\phi$ for $\langle \phi, emptyUP\rangle$, respectively.

Collecting Explanatory Points

Each node in the formula tree is a pair of an operator and a cycle map (US,UP) specifying the set of used signals for each cycle number. For each cycle number n, $US(n) \subseteq \Sigma$. $UP(n)$ is a set of pairs $\langle where, name\rangle$ where name name $\in \Sigma$ and where is a tag indicating whether name was used in a suffix implication left hand side (lhs) or elsewhere (rhs)

We define Definition 9

$$us_1 \cup us_2 = u \text{ such that for each } n, u(n) = us_1(n) \cup us_2(n)$$

We define Definition 10

$$us_1 \cup us_2 = u \text{ such that for each } n, u(n) = us_1(n) \cup us_2(n)$$

if $U \subseteq \Sigma$ (or U is a set of $\langle where, name\rangle$ pairs) and n is a cycle number, let unitcm(U, n) be the cycle map US such that $US(n) = U$ and $US(m) = \emptyset$ if $m \neq n$.

We also define, recursively, Definition 11

$$merge(U_1, \ldots, U_n) = \begin{cases} U_1 & \text{if } n = 1 \\ U_1 \cup U_2 & \text{if } n = 2 \\ merge(merge(U_1, \ldots U_{n-1}), U_n) & \text{if } n > 2 \end{cases}$$

if $U \subseteq \Sigma$ (or U is a set of $\langle where, name\rangle$ pairs) and US is a cycle map and n a cycle number then let:

$$append\ (US, U, n) = merge\ (US, unitcm(U, n))$$

emptyUS=F, where for all n $F(n) = \emptyset$
emptyUP=F, where for all n $F(n) = \emptyset$.

Definition 12

$$laterused(US_1, US_2) =$$
$$\begin{cases} US_2 & \text{if start } (US_1) < start(US_2) \vee US_1 = emptyUS \\ US_1 & \text{otherwise.} \end{cases}$$

We extend Definition 12 to the case where the operands are other than two.

Definition 13

$$mlaterused(US_1, \ldots US_n) =$$
$$\begin{cases} US_1 & \text{if } US_1 = US_2 \\ laterused(US_1, US_n) & \text{if } n = 2 \\ laterused(US_1, mlaterused(US_2, \ldots US_n)) & \text{otherwise} \end{cases}$$

If s is a sequence, let $$addUS(\langle s, US_1\rangle, US_2) = \langle s, merge(US_1, US_2)\rangle$$

If p is a formula, let $$addUP(\langle p, UP_1\rangle, UP_2) = \langle p, merge(UP_1, UP_2)\rangle$$

Let toLhss(US)=UP, where for all n
$$UP(n) = \{\langle lhs, name\rangle | name \in US(n)\}$$
and let toRhss(US)=UP, where for all n
$$UP(n) = \{\langle rhs, name\rangle | name \in US(n)\}.$$

The following functions are used to collect signals that were used for checking a particular sequence or formula. getUsedsS(s) collects and merges all the USs in s, and getUsedsP(p) collects and merges all the UPs in p.

The interesting cases in getUsedsP is where getUsedsS gets used.

getUsedsP($\langle (s \mapsto p)$, UP$\rangle$)=merge(UP, toLhss(getUsedsS(s)), getUsedsP(p)) getUsedsP($\langle \{s\}$, UP$\rangle$)= merge(UP, toRhss(getUsedsS(s)))

We define Definition 14

$$us_1 \subseteq us_2 \Leftrightarrow \text{for each } n,\ us_1(n) \subseteq us_2(n)$$

Sequence Step Function with ATD

The seqstep function defines the operational semantics for Seq's. It defines a stepwise transformation of a sequence when traversing a word. This is done in such a way that sequence matching is syntactically detectable (see the em function below).

Definition 17

$$seqstep(n, l, \langle [*0], US\rangle) = \langle \perp, US\rangle$$
$$seqstep(n, l, \langle \perp, US\rangle) = \langle \perp, US\rangle$$

$$seqstep(n, l, \langle b, US\rangle) = \langle S, append(US, U, n)\rangle \text{ where}$$
$$\langle tf, U\rangle = bs(b, l)$$
$$S = \begin{cases} [*0] & \text{if } tf \\ \perp & \text{otherwise} \end{cases}$$
$$seqstep(n, l, \langle (s_1 \&\& s_2), US\rangle) = \langle (s'_1 \&\& s'_2), US\rangle \text{ where}$$
$$s'_1 = seqstep(n, l, s_1)$$
$$s'_2 = seqstep(n, l, s_2)$$
$$seqstep(n, l, \langle (s_1 | s_2), US\rangle) = \langle (s'_1 | s'_2), US\rangle \text{ where}$$
$$s'_1 = seqstep(n, l, s_1)$$
$$s'_2 = seqstep(n, l, s_2)$$

$$seqstep(n, l, \langle (s_1; s_2), US\rangle) = S \text{ where}$$
$$S = \begin{cases} \langle (s'_2 | (s'_1; s_2)), US\rangle & \text{if } ae \\ \langle (s'_1; s_2), US\rangle & \text{otherwise} \end{cases}$$
$$\langle ae, us\rangle = em(s_1)$$
$$s'_1 = seqstep(n, l, s_1)$$
$$s'_2 = addUS(seqstep(n, l, s_2), us)$$
$$seqstep(n, l, \langle (s_1; s_2), US\rangle) = S \text{ where}$$
$$S = \begin{cases} \langle (s'_2 | (s'_1; s_2)), US\rangle & \text{if } ae \\ \langle (s'_1; s_2), US\rangle & \text{otherwise} \end{cases}$$
$$\langle ae, us\rangle = em(s'_1)$$
$$s'_1 = seqstep(n, l, s_1)$$
$$s'_2 = addUS(seqstep(n, l, s_2), us)$$

$$seqstep(n, l, \langle s[*], US\rangle) = \langle (s'; s[*]), US\rangle \text{ where}$$
$$s'_1 = seqstep(n, l, s_1)$$

-continued $predstep(n, l, \langle alwaysp, UP \rangle) = predstep(n, l, \langle (pandnap), UP \rangle)$ where
$nap = next[1]alwaysp$ $predstep(n, l, \langle (p_1 until p_2), UP \rangle) = predstep(n, l, \langle (p_2 or(p_1 and nu)), UP \rangle)$ where
$nu = next[1](p_1 until p_2)$ $predstep(n, l, \langle next[m]p_2, UP \rangle) = \begin{cases} predstep(n, l, \\ addUP(p_2, UP)) & \text{if } m = 0, \\ \langle next[m-1]p_2, UP \rangle & \text{otherwise.} \end{cases}$ $predstep(n, l, \langle (p_1 and p_2), UP \rangle) = \langle (p'_1 and p'_2), UP \rangle$ where
$p'_1 = predstep(n, l, p_1)$
$p'_2 = predstep(n, l, p_2)$ $predstep(n, l, \langle (p_1 or p_2), UP \rangle) = \langle (p'_1 or p'_2), UP \rangle$ where
$p'_1 = predstep(n, l, p_1)$
$p'_2 = predstep(n, l, p_2)$ $predstep(n, l, \langle (s \mapsto p), UP \rangle) = \begin{cases} ((p' and(s' \mapsto p)), UP) & \text{if } ae \\ ((s' \mapsto p), UP) & \text{otherwise.} \end{cases}$
where
$\langle ae, us \rangle = em(s')$
$s' = seqstep(n, l, s)$
$p' = addLhss(predstep(n, l, p), us)$ $predstep(n, l, \langle (pabortb), UP \rangle) = \begin{cases} \langle \{[*0]\}, merge(UP, pus, F) \rangle & \text{if } ok \wedge tf \\ \langle (p' abortb), merge(UP, F) \rangle & \text{otherwise} \end{cases}$
where
$\langle ok, us \rangle = okp(p)$
$\langle tf, U \rangle = bs(b, l)$
$pus = getUsedsP(p)$
$F = toRhss(unitcm(U, n))$
$p' = predstep(n, l, p)$ $predstep(n, l, \langle \{s\}, UP \rangle) = \begin{cases} \langle \{[*0]\}, UP \rangle & \text{if } ae \\ \langle \{seqstep(n, l, s)\}, UP \rangle & \text{otherwise} \end{cases}$
where
$\langle ae, us \rangle = em(s)$ Formula Step Function with ATD $predstep(n, l, \langle always_p, UP \rangle) = predstep(n, l, \langle (pandnap), UP \rangle)$
where
$nap = next\ [1]\ alwaysp$ $predstep(n, l, \langle (p_1 until p_2), UP \rangle) = predstep(n, l, \langle p_2 or(p_1 and nu)), UP \rangle)$ where
$nu = next\ [1](p_1 until p_2)$ $predstep(n, l, \langle next[m]p_2, UP \rangle) = \begin{cases} predstep(n, l, & \text{if } m = 0 \\ addUP(p_2, UP)) & \\ \langle next[m-1]p_2, & \text{otherwise,} \\ UP \rangle & \end{cases}$ $predstep(n, l, \langle (p_1 and p_2), UP \rangle) = \langle (p'_1 and p'_2), UP \rangle$ where
$p'_1 = predstep(n, l, p_1)$
$p'_2 = predstep(n, l, p_2)$ $predstep(n, l, \langle (p_1 or p_2), UP \rangle) = \langle (p'_1 or p'_2), UP \rangle$ where
$p'_1 = predstep(n, l, p_1)$
$p'_2 = predstep(n, l, p_2)$ $predstep(n, l, \langle (s \mapsto p), UP \rangle) = \begin{cases} ((p' and(s' \mapsto p)) & \text{if } ae \\ \langle (s' \mapsto p), UP \rangle & \text{otherwise,} \end{cases}$
where
$\langle ae, us \rangle = em(s')$
$s' = seqstep(n, l, s)$
$p' = addLhss(predstep(n, l, p), us)$ $predstep(n, l, \langle (pabortb), UP \rangle) = \begin{cases} \langle \{[*0]\}, merge(UP, & \text{if } ok \wedge tf \\ pus, F) \rangle & \square \\ \langle (p' abortb), & \text{otherwise,} \\ merge(UP, F) \rangle & \square \end{cases}$
where
$\langle ok, us \rangle = okp(p)$
$\langle tf, U \rangle = bs(b, l)$
$pus = getUsedsP(p)$
$F = toRhss(unitcm(U, n))$
$p' = predstep(n, l, p$ $predstep(n, l, \langle \{s\}, UP \rangle) = \begin{cases} \langle \{[*0]\}, UP \rangle & \text{if } ae \\ \langle \{seqstep(n, l, s)\}, UP \rangle & \text{otherwise,} \end{cases}$
where
$\langle ae, us \rangle = em(s)$ The em Function The em function checks whether a Seq can accept the empty word. At the same time it collects all explanatory points needed for establishing this fact.

Definition 18

$em(\langle [*0], US \rangle) = \langle True, US \rangle$
$em(\langle \perp, US \rangle) = \langle False, emptyUS \rangle$
$em(\langle b, US \rangle) = \langle False, emptyUS \rangle$ $$em(\langle\langle s_1 \&\& s_2\rangle, US\rangle) = \langle ae, US'\rangle \text{ where}$$
$$ae = ae_1 \wedge ae_2$$
$$US' = \begin{cases} merge(US, us_1, us_2) & \text{if } ae \\ emptyUS & \text{otherwise.} \end{cases}$$
$$\langle ae_1, us_1\rangle = em(s_1)$$
$$\langle ae_1, us_2\rangle = em(s_2)$$

$$em(\langle\langle s_1 \mid s_2\rangle, US\rangle) = \langle ae, US'\rangle \text{ where}$$
$$ae = ae_1 \vee ae_2$$
$$US' = \begin{cases} merge(US, laterused(us_1, us_2)) & \text{if } ae \\ emptyUS & \text{otherwise.} \end{cases}$$
$$\langle ae_1, us_1\rangle = em(s_1)$$
$$\langle ae_2, us_2\rangle = em(s_2)$$

$$em(\langle\langle s_1; s_2\rangle, US\rangle) = \langle ae, US'\rangle \text{ where}$$
$$ae = ae_1 \wedge ae_2$$
$$US' = \begin{cases} merge(US, us_1, us_2) & \text{if } ae \\ emptyUS & \text{otherwise.} \end{cases}$$
$$\langle ae_1, us_1\rangle = em(s_1)$$
$$\langle ae_2, us_2\rangle = em(s_2)$$
$$em(\langle\langle s_1; s_2\rangle, US\rangle) = \langle False, emptyUS\rangle$$
$$em(\langle s[*], US\rangle) = \langle True, merge(US, getUsedsS(s))\rangle$$

The okp Function

The okp function checks whether a Pred is definitively contradicted. At the same time it collects all explanatory points needed for establishing this fact.

Definition 19

$$okp(\langle alwaysp, UP\rangle) = \langle ok, emptyUP\rangle \text{ where}$$
$$\langle ok, u\rangle = okp(p)$$

$$okp(\langle\langle p_1 untilp_2\rangle, UP\rangle) = \langle ok_1 \| ok_2, emptyUP\rangle \text{ where}$$
$$\langle ok_1, u_1\rangle = okp(p_1)$$
$$\langle ok_2, u_2\rangle = okp(p_2)$$

$$okp(\langle next[n]p, UP\rangle) = \begin{cases} okp(p) & \text{if } n = 0 \\ \langle True, emptyUP\rangle & \text{if } n > 0 \end{cases}$$

$$okp(\langle\langle p_1 andp_2\rangle, UP\rangle) = \langle ok, u\rangle \text{ where}$$
$$\langle ok_1, u_1\rangle = okp(p_1)$$
$$\langle ok_2, u_2\rangle = okp(p_2)$$
$$ok = ok_1 \wedge ok_2$$
$$u = \begin{cases} emptyUP & \text{if } ok \\ merge(UP, laterused(u_1, u_2)) & \text{otherwise} \end{cases}$$

$$okp(\langle\langle p_1 orp_2\rangle, UP\rangle) = \langle ok, u\rangle \text{ where}$$
$$\langle ok_1, u_1\rangle = okp(p_1)$$
$$\langle ok_2, u_2\rangle = okp(p_2)$$
$$ok = ok_1 \vee ok_2$$
$$u = \begin{cases} emptyUP & \text{if } ok \\ merge(UP, u_1, u_2) & \text{otherwise} \end{cases}$$

$$okp(\langle\langle s \mapsto p\rangle, UP\rangle) = \langle True, emptyUP\rangle$$

$$okp(\langle\langle pabortb\rangle, UP\rangle) = \begin{cases} \langle True, emptyUP\rangle & \text{if } ok \\ \langle False, merge(UP, getUsedsP(p))\rangle & \text{otherwise} \end{cases}$$
where
$$\langle ok, u\rangle = okp(p)$$

$$okp(\langle\{s\}, UP\rangle) = \begin{cases} \langle True, \phi\rangle & \text{if } oks(s) \\ \langle False, merge(UP, getUsedsS(p))\rangle & \text{otherwise} \end{cases}$$

We will define a strong variant of formula equivalence.

The oks Function

Definition 21

$$oks(\langle[*0], US\rangle) = \langle True, emptyUS\rangle$$
$$oks(\langle \perp, US\rangle) = \langle False, US\rangle$$
$$oks(\langle b, US\rangle) = \langle True, emptyUS\rangle$$

$$oks(\langle\langle s_1 \&\& s_2\rangle, US\rangle) = \langle ok, us\rangle$$
$$\langle ok_1 us_1\rangle = oks(s_1)$$
$$\langle ok_2 us_2\rangle = oks(s_2)$$
$$ok = ok_1 \wedge ok_2$$
$$us = \begin{cases} emptyUS & \text{if } ok \\ merge(US, laterused(u1, u2)) & \text{otherwise} \end{cases}$$

$$oks(\langle\langle s_1 \mid s_2\rangle, US\rangle) = \langle ok, us\rangle$$
$$\langle ok_1 us_1\rangle = oks(s_1)$$
$$\langle ok_2 us_2\rangle = oks(s_2)$$
$$ok = ok_1 \vee ok_2$$
$$us = \begin{cases} emptyUS & \text{if } ok \\ merge(US, u1, u2) & \text{otherwise} \end{cases}$$

$$oks(\langle\langle s_1; s_2\rangle, US\rangle) = \langle ok_1, us\rangle$$
$$\langle ok_1, us_1\rangle = oks(s_1)$$
$$us = \begin{cases} emptyUS & \text{if } ok_1 \\ merge(US, us) & \text{otherwise} \end{cases}$$

$$oks(\langle\langle s_1:s_2\rangle, US\rangle) = \langle ok_1, us\rangle$$
$$\langle ok_1 us_1\rangle = oks(s_1)$$
$$us = \begin{cases} emptyUS & \text{if } ok_1 \\ merge(US, us) & \text{otherwise} \end{cases}$$

$$oks(\langle s[*], US\rangle) = \langle True, emptyUS\rangle$$

Definition 22
For Pred $\phi$ and finite word $l_n \ldots l_m$ such that $SI(v)=n$ $$\phi\langle l_n \ldots l_m\rangle = \begin{cases} \phi & \text{if } |l_n \ldots l_m| = 0 \\ predstep(m, l_m, \phi) & \text{if } n = m \\ predstep(m, l_m, \phi\langle l_n \ldots l_{m-1}\rangle) & \text{otherwise} \end{cases}$$

Definition 23
For Seq s and finite word $l_n \ldots l_m$ such that $SI(v)=n$ $$s\langle l_n \ldots l_m\rangle = \begin{cases} s & \text{if } |l_n \ldots l_m| = 0 \\ seqstep(m, l_m, s) & \text{if } n = m \\ seqstep(m, l_m, s\langle l_n \ldots l_{m-1}\rangle) & \text{otherwise} \end{cases}$$

Abstraction of Letters and Words
Definition 24
If $U \subseteq \Sigma$ is a set of signal names and $\langle T,F\rangle$ a letter, let abstractl$(U,\langle T,F\rangle)=\langle T \cap U, F \cap U\rangle$
Definition 25
If u is a word and US is a cycle map, let abstractw(US,u)=u' such that $|u'|=|u|$, $SI(u)=SI(u')$ and such that for each $n<|u|$, $u'(SI(u)+n)=$abstractl$(US(SI(u)+n), u(SI(u)+n))$
The ATD Function
The ATD function defines for each sequences s and each word w an abstraction of w. Below we will show that this function has the ATD property described above.

(Let $okp'(p)=ok$ where $okp(p)=<ok,n>$)

Definition 25 (atddef) Let ATD(u,p)=u' where $\langle ok, UP\rangle=$kp(p<u>), u'=abstractw(UP,u).
Pred ATD Sufficiency and Minimality
Observation 1 If
u is a (full) finite word, and
not $okp'(p\langle u\rangle)$, and
if $v \prec u$, then $okp'(p\langle v\rangle)$, and
ATD(u,p)=u', then
for any full v s.t. $u' \sqsubseteq v$, not $okp'(p\langle v\rangle)$, and
for any v s.t. $v \sqsubset u'$ there is full v' such that $v \sqsubseteq v'$ and $okp'(p\langle v\rangle)$

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer-implemented method for debugging counterexamples found in formal verification, the method comprising:
receiving, by using a computer, a trace that illustrates a behavior of a circuit design that violates a property defined for the circuit design;
selecting a set of explanatory points for the violated property, the explanatory points illustrating a portion of the trace of the counterexample that directly contributes to the violation of the property; and
displaying the trace of the counterexample to the user; and
displaying an indication of the explanatory points on the trace of the counterexample.

2. The method of claim 1, wherein the trace is for a counterexample identified for the circuit design during a formal verification process.

3. The method of claim 1, wherein the property is a covered property, and the trace is a cover trace comprising a counterexample to a negation of the covered property.

4. The method of claim 1, wherein the set of explanatory points is both sufficient and minimal.

5. The method of claim 1, wherein selecting a set of explanatory points for the violated property comprises:
identifying a plurality of sets of explanatory points; and
choosing one of the plurality sets of explanatory points that has the least difference between the earliest cycle and the failure point.

6. The method of claim 1, wherein selecting a set of explanatory points for the violated property comprises:
  identifying a plurality of sets of explanatory points; and
  choosing one of the plurality sets of explanatory points that contains the least number of points.

7. The method of claim 1, wherein the set of explanatory points includes at least one point that contributes to the triggering of the property and at least one point that contributes directly to the violation of the property.

8. The method of claim 1, wherein displaying an indication of the explanatory points comprises displaying the points that contribute to the triggering of the property differently than the points that contribute directly to the violation of the property.

9. The method of claim 8, wherein the points that contribute to the triggering of the property are displayed using a different color than the points that contribute directly to the violation of the property.

10. The method of claim 1, wherein displaying an indication of the explanatory points comprises displaying inessential points.

11. The method of claim 1, further comprising:
  receiving a user selection of a cycle, wherein displaying the trace of the counterexample is responsive to the selected cycle.

12. The method of claim 1, further comprising:
  displaying source code of at least one of the property and the circuit design;
  receiving user selections to step through the source code view to display subsequent cycles of the trace; and
  displaying an indication of the explanatory points in the source code view.

13. A computer program product for debugging counterexamples found in formal verification, the computer program product comprising a non-transitory computer-readable storage medium containing computer program code for:
  receiving a trace that illustrates a behavior of a circuit design that violates a property defined for the circuit design;
  selecting a set of explanatory points for the violated property, the explanatory points illustrating a portion of the trace of the counterexample that directly contributes to the violation of the property; and
  displaying the trace of the counterexample to the user; and
  displaying an indication of the explanatory points on the trace of the counterexample.

14. The computer program product of claim 13, wherein the trace is for a counterexample identified for the circuit design during a formal verification process.

15. The computer program product of claim 13, wherein the property is a covered property, and the trace is a cover trace comprising a counterexample to a negation of the covered property.

16. The computer program product of claim 13, wherein the set of explanatory points is both sufficient and minimal.

17. The computer program product of claim 13, wherein selecting a set of explanatory points for the violated property comprises:
  identifying a plurality of sets of explanatory points; and
  choosing one of the plurality sets of explanatory points that has the least difference between the earliest cycle and the failure point.

18. The computer program product of claim 13, wherein selecting a set of explanatory points for the violated property comprises:
  identifying a plurality of sets of explanatory points; and
  choosing one of the plurality sets of explanatory points that contains the least number of points.

19. The computer program product of claim 13, wherein the set of explanatory points includes at least one point that contributes to the triggering of the property and at least one point that contributes directly to the violation of the property.

20. The computer program product of claim 13, wherein displaying an indication of the explanatory points comprises displaying the points that contribute to the triggering of the property differently than the points that contribute directly to the violation of the property.

21. The computer program product of claim 20, wherein the points that contribute to the triggering of the property are displayed using a different color than the points that contribute directly to the violation of the property.

22. The computer program product of claim 13, wherein displaying an indication of the explanatory points comprises displaying inessential points.

23. The computer program product of claim 13, further comprising:
  receiving a user selection of a cycle, wherein displaying the trace of the counterexample is responsive to the selected cycle.

24. The computer program product of claim 13, further comprising:
  displaying source code of at least one of the property and the circuit design;
  receiving user selections to step through the source code view to display subsequent cycles of the trace; and
  displaying an indication of the explanatory points in the source code view.

25. The method of claim 1, wherein the explanatory points comprise one or more signal-cycle points of the trace of the counterexample that contribute directly to the violation of the property.

* * * * *